(12) United States Patent
Bucchignano et al.

(10) Patent No.: US 7,893,549 B2
(45) Date of Patent: Feb. 22, 2011

(54) MICROELECTRONIC LITHOGRAPHIC ALIGNMENT USING HIGH CONTRAST ALIGNMENT MARK

(75) Inventors: James J. Bucchignano, Yorktown Heights, NY (US); Mary Beth Rothwell, Ridgefield, CT (US); Robert Luke Wisneiff, Ridgefield, CT (US); Roy Rongquing Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 667 days.

(21) Appl. No.: 11/838,507

(22) Filed: Aug. 14, 2007

(65) Prior Publication Data

US 2009/0045530 A1    Feb. 19, 2009

(51) Int. Cl.
*H01L 23/544* (2006.01)
(52) U.S. Cl. .............................. 257/797; 257/E23.179
(58) Field of Classification Search ................. 257/797, 257/E23.179
See application file for complete search history.

(56) References Cited

U.S. PATENT DOCUMENTS

| | | |
|---|---|---|
| 4,812,661 A | 3/1989 | Owen |
| 5,989,759 A | 11/1999 | Ando et al. |
| 6,020,107 A | 2/2000 | Niiyama et al. |
| 6,093,931 A | 7/2000 | Sugihara |
| 6,492,094 B1 | 12/2002 | Bojko |
| 6,875,624 B2 | 4/2005 | Lin |
| 6,941,008 B2 | 9/2005 | Ando et al. |
| 7,160,657 B2 | 1/2007 | Smith et al. |

OTHER PUBLICATIONS

Yu, et al, VMIC2005, p. 211 "BEOL Interconnects for 45 nm node and beyond".
Geppert, L.; Spectrum, IEEE, vol. 41, Issue 5, May 2004, p. 29-33.
Mack,C.A.;Adv.Semi. Manuf.Conf.andWkshop;2005 IEEE/SEMI, Apr. 11-12, 2005 p. 58-63.
Owa,S.; Ishii,Y.; Shiraishi,K.; Adv. Semi. Manuf. Conf. and Workshop, 2005 IEEE/SEMI, Apr. 11-12, 2005, p. 53-57.
Rothschild, M. et al; JVST B: Microelectronics and Nanometer Structure., vol. 22, No. 6, Nov./Dec. 2004, p. 2877-2881.
Hou-Yu Chen, et al; VLSI Technology, 2005. Digest of Technical Papers. 2005 Symposium on, Jun. 14-16, 2005 p. 16-17.

(Continued)

*Primary Examiner*—Zandra Smith
*Assistant Examiner*—Paul E Patton
(74) *Attorney, Agent, or Firm*—Scully, Scott, Murphy & Presser, P.C.; Daniel P. Morris, Esq.

(57) ABSTRACT

A microelectronic structure, and in particular a semiconductor structure, includes a substrate that includes an alignment mark comprising a substantially present element that has an atomic number at least 5 greater than a highest atomic number substantially present element within the substrate. Alignment to the alignment mark may be effected using an electron beam as an alignment beam with respect to both a direct write exposure and a reticle filtered optical exposure of a mask layer (i.e., photoresist mask layer) located over the alignment mark and the substrate. The electron beam alignment beam may effectively penetrate through other layers, including conductor layers comprising elements having appropriately low atomic number, located interposed between the alignment mark and the mask layer.

12 Claims, 11 Drawing Sheets

OTHER PUBLICATIONS

Silverman, P.J.; J. of Microlith, Microfab, and Microsys.; vol. 4, No. 1: 11006-1-5, Jan. 2005.
Hector, S.D. and Kemp, K.; Proc. of SPIE—Int'l. Soc. for Op Eng.; v5446, nPART 2, Photomask and Next-Gen Lithography Mask Tech.; XI, 2004, p. 792-803.
Chou, S.Y., Krauss, P.R.; Renstrom, P.J.; Applied Phys. Let., 67(21), p. 3114-3116, 1995.
Gates, Byron D. et al; Chemical Reviews, v105, n4, Apr. 2005, p. 1171-1196.
Austin, Michael D. et al; Nanotechnology, v 16, n. 8, Aug. 1, 2005, p. 1058-1061.

MICROELECTRONIC LITHOGRAPHIC ALIGNMENT USING HIGH CONTRAST ALIGNMENT MARK

BACKGROUND

1. Field of the Invention

The invention relates generally to lithography methods and lithography structures for fabricating microelectronic structures. More particularly, the invention relates to enhanced performance lithography methods and lithography structures for fabricating microelectronic structures.

2. Description of the Related Art

Microelectronic structures, and in particular semiconductor structures, are fabricated using lithographic methods. Lithographic methods typically include the use of successive resist layers that are latently imaged and subsequently developed and patterned over a substrate, such as but not limited to a semiconductor substrate, for purposes of fabricating any of several structures within the substrate. Particular structures that may be fabricated within a semiconductor substrate while using a patterned resist layer include: (1) selectively deposited structures; and (2) selectively etched structures; as well as (3) selectively ion implanted structures. Particular additional structures that may be fabricated with respect to a semiconductor substrate include semiconductor device related structures and contact structures connected thereto, as well as multilayer dielectric and metallization (i.e., via and interconnect) structures.

The use of lithographic methods when fabricating microelectronic structures is certain to continue as microelectronic fabrication technology advances. However, as microelectronic structure and device dimensions decrease and microelectronic integration levels increase, performance requirements of lithographic methods that are used for fabricating microelectronic structures also generally increase.

Various lithographic methods and lithographic structures that are used for fabricating microelectronic structures are known within the microelectronic fabrication art. For example, Lin, in U.S. Pat. No. 6,875,624, teaches a lithographic method for efficiently and effectively fabricating a semiconductor structure. This particular lithographic method uses an electron beam lithography method for fabricating critically dimensioned semiconductor structures located within a semiconductor substrate, and an optical lithography method for fabricating non-critically dimensioned semiconductor structures located within the semiconductor substrate.

In addition, Smith et al., in U.S. Pat. No. 7,160,657, teaches a particular method for calibrating a lithographic exposure apparatus that may be used for fabricating a semiconductor structure. The particular method uses a reference reticle that includes a two-dimensional array of otherwise standard alignment attributes.

Microelectronic structure and device dimensions, including in particular semiconductor structure and device dimensions, are certain to continue to decrease as microelectronic technology advances. To that end, desirable are advanced lithographic methods and structures that efficiently facilitate continued microelectronic structure and microelectronic device scaling.

SUMMARY OF THE INVENTION

The invention provides a microelectronic structure, and in particular a semiconductor structure, as well as a method for fabricating the microelectronic structure, and in particular the semiconductor structure.

A microelectronic structure in accordance with the invention includes a substrate that includes an alignment mark. Within the microelectronic structure, the alignment mark comprises, and preferably consists essentially of, at least one substantially present element having an atomic number at least 5 greater than a highest atomic number substantially present element within surrounding materials (i.e., within the substrate), and preferably at least 10 greater, and more preferably at least 20 greater than the highest atomic number substantially present element within surrounding materials. Typically, within the context of a silicon containing semiconductor and/or dielectric substrate, the alignment mark will comprise a substantially present element having an atomic number greater than about 19, more preferably from about 19 to about 109 and still more preferably from about 55 to about 86. Although by no means limiting the invention, a particular candidate material for the alignment mark includes a tungsten material.

The term "substantially present element" is intended to represent an element present in greater than about 25 atomic percent, more preferably greater than about 50 atomic percent and still more preferably greater than about 75 atomic percent. Intended to be excluded are "insubstantially present elements" such as dopant elements within semiconductor substrates, that are present in amounts generally much less than 1 atomic percent.

A method for fabricating a microelectronic structure in accordance with the invention uses the alignment mark for alignment of overlying layers with respect to the substrate that includes the alignment mark. Particular alignment to the alignment mark is effected using an electron beam alignment beam, where electron beam contrast between electron beam irradiated materials is a function of an atomic number of the electron beam irradiated materials. Since many common and conventional microelectronic fabrication materials include materials that have generally lower atomic numbers which provide limited contrast within the context of an electron beam alignment beam, an alignment mark that comprises a higher atomic number element such as tungsten may serve as an effective alignment mark with a higher non-linear contrast as a function of atomic number, in comparison with alignment marks that are comprised of those lower atomic number materials. Such a higher non-linear contrast allows for alignment to such an alignment mark through several layers of lower atomic number materials located upon the alignment mark.

A particular microelectronic structure in accordance with the invention includes a substrate and an alignment mark located over at least a portion of the substrate. The alignment mark includes at least one substantially present element that has an atomic number at least 5 greater than a highest atomic number substantially present element within the substrate The alignment mark may comprise or consist essentially of at least one element selected from rows 4-7 of the Periodic Table of the Elements.

A particular method for fabricating a microelectronic structure in accordance with the invention includes forming a resist layer over a substrate and an alignment mark formed over the substrate, to provide the alignment mark interposed between the resist layer and the substrate. The alignment mark includes at least one substantially present element having an atomic number at least 5 greater than a highest atomic number substantially present element within the substrate. The particular method also includes aligning at least one exposure beam with respect to the resist layer and the substrate while using the alignment mark.

Another particular method for fabricating a microelectronic structure in accordance with the invention includes forming a resist layer over a successively layered substrate, alignment mark and conductor layer to provide: (1) the alignment mark formed interposed between the resist layer and the substrate, and comprising at least one substantially present element having an atomic number at least 5 greater than a highest atomic number element substantially present within the conductor layer; and (2) the conductor layer formed interposed between the resist layer and the alignment mark. This particular method also includes aligning at least one exposure beam with respect to the resist layer and the substrate while using an alignment beam that passes through the conductor layer to reach the alignment mark.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which comprises a microelectronic structure that includes an alignment mark comprising a particularly defined material composition, as well as a method for fabricating a microelectronic structure that uses the alignment mark comprising the particularly defined material composition, is understood within the context of the description that follows. The description that follows is understood within the context of the drawings described above. Since the drawings are intended for illustrative purposes, the drawings are not necessarily drawn to scale.

Figure 1:
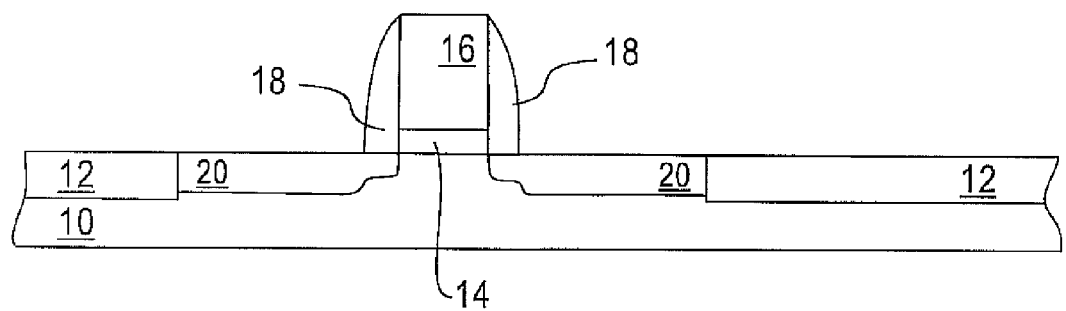
FIG. 1 to FIG. 14 show a series of schematic cross-sectional diagrams illustrating the results of progressive stages in fabricating a semiconductor structure in accordance with a particular embodiment of the invention.

FIG. 1 to FIG. 14 show a series of schematic cross-sectional diagrams illustrating the results of progressive stages in fabricating a semiconductor structure in accordance with a particular embodiment of the invention. FIG. 1 shows a schematic cross-sectional diagram of the semiconductor structure at an early stage in the fabrication thereof in accordance with this particular embodiment of the invention.

FIG. 1 shows a semiconductor substrate 10. FIG. 1 also shows a plurality of isolation regions 12 that are included within and embedded within the semiconductor substrate 10. Within the embodiment and the claimed invention, the semiconductor substrate 10 provides a reference substrate within, upon above and over which layers and structures are located and formed.

The semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the semiconductor substrate 10 has a thickness from about 1 to about 3 mm.

The isolation regions 12 may comprise any of several dielectric isolation materials. Non-limiting examples include oxides, nitrides and oxynitrides, particularly of silicon, but oxides, nitrides and oxynitrides of other elements are not excluded. The dielectric isolation materials may be formed using any of several methods. Non-limiting examples include thermal or plasma oxidation or nitridation methods, chemical vapor deposition methods and physical vapor deposition methods. Also included are adjunct planarizing methods, such as but not limited to mechanical planarizing methods and chemical mechanical polish planarizing methods, that are used for planarizing the isolation regions 12 with respect to the semiconductor substrate 10. Typically, the isolation regions 12 comprise at least in part an oxide of the semiconductor material from which is comprised the semiconductor substrate 10. Typically, the isolation regions 12 are intended as shallow trench isolation regions that have a depth within the semiconductor substrate 10 from about 2000 to about 6000 angstroms.

Although the instant embodiment generally illustrates the invention within the context of the semiconductor substrate 10 that is intended as a bulk semiconductor substrate, neither the instant embodiment specifically, nor the invention more generally, is intended to be so limited. Rather the instant embodiment and the invention may be practiced using as an alternative to a bulk semiconductor substrate such as the semiconductor substrate 10, either a semiconductor-on-insulator substrate, or alternatively a hybrid orientation substrate. As a further alternative, the instant embodiment and the invention may also be practiced within the context of microelectronic substrates which need not necessarily include semiconductor substrates.

Semiconductor-on-insulator substrates include a buried dielectric layer interposed between a base semiconductor substrate portion of a semiconductor substrate (i.e., such as the semiconductor substrate 10) and a surface semiconductor layer portion of the semiconductor substrate (i.e., such as the semiconductor substrate 10). The buried dielectric layer may comprise dielectric materials generally analogous, equivalent or identical to the dielectric materials from which may be comprised the isolation regions 12. The base semiconductor substrate and the surface semiconductor layer may comprise the same or different semiconductor materials with respect to semiconductor material composition, crystallographic orientation, dopant polarity and dopant concentration.

Hybrid orientation substrates include multiple semiconductor regions of different crystallographic orientation that are supported by a single semiconductor substrate. Semiconductor-on-insulator substrates and hybrid orientation substrates may be formed using generally conventional methods. Such generally conventional methods typically include, but are not necessarily limited to, ion implantation oxidation methods, layer transfer methods and layer lamination methods.

FIG. 1 also shows (in cross-section) a field effect transistor (i.e., a semiconductor device) located within and upon an active region of the semiconductor substrate 10 that separates the isolation regions 12 that are located embedded within the semiconductor substrate 10. The field effect transistor (i.e., which may be fabricated as an nFET, a pFET or alternatively as a CMOS structure including an nFET and a pFET) comprises: (1) a gate dielectric 14 located upon the active region of the semiconductor substrate 10; (2) a gate electrode 16 located upon the gate dielectric 14; (3) a spacer 18 (illustrated as plural layers in cross-section but intended as a single layer that encircles the gate electrode 16 in plan-view) located adjoining opposite sidewalls of the gate dielectric 14 and the gate electrode 16; and (4) a plurality of source/drain regions 20 located within the semiconductor substrate 10 and separated by a channel that is aligned beneath the gate electrode 16. Beyond the planar field effect structure that is illustrated in FIG. 1, the embodiment and the invention also contemplate applicability to finFET structures, trigate transistor structures and backgate transistor structures.

Each of the foregoing layers and structures included within the field effect transistor may comprise materials and have dimensions that are conventional in the semiconductor fabrication art. Each of the foregoing layers and structures included within the field effect transistor may also be formed using methods that are conventional in the semiconductor fabrication art.

The gate dielectric 14 may comprise conventional gate dielectric materials such as but not limited to oxides, nitrides and oxynitrides of silicon that have a dielectric constant from about 4 to about 20, measured in vacuum. Alternatively, the gate dielectric 14 may comprise generally higher dielectric constant gate dielectric materials having a dielectric constant from about 20 to at least about 100. Such higher dielectric constant gate dielectric materials may include, but are not limited to hafnium oxides, hafnium silicates, titanium oxides, barium-strontium-titantates (BSTs) and lead-zirconate-titanates (PZTs). The gate dielectric 14 may be formed using any of several methods that are appropriate to its material(s) of composition. Included but not limiting are thermal or plasma oxidation or nitridation methods, chemical vapor deposition methods and physical vapor deposition methods. Typically, the gate dielectric 14 comprises a thermal silicon oxide gate dielectric material that has a thickness from about 10 to about 70 angstroms.

The gate electrode 16 may comprise gate electrode conductor materials including but not limited to certain metals, metal alloys, metal nitrides and metal silicides, as well as laminates thereof and composites thereof. The gate electrode 16 may also comprise doped polysilicon and polysilicon-germanium alloy gate electrode conductor materials (i.e., having a dopant concentration from about 1e18 to about 1e22 dopant atoms per cubic centimeter) and polycide materials (doped polysilicon (or polysilicon-germanium alloy)/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrode 16 comprises a doped polysilicon conductor material that has a thickness from about 600 to about 2000 angstroms.

The spacer 18 may comprise materials including but not limited to conductor materials and dielectric materials. Conductor spacer materials are less common, but are nonetheless known. Dielectric spacer materials are more common. The spacer materials may be formed using methods analogous, equivalent or identical to the methods that are used for forming the isolation regions 12. The spacer 18 is also formed with the distinctive inward pointing spacer shape by using a blanket layer deposition and anisotropic etchback method. Typically, the spacer 18 comprises at least in-part a silicon oxide dielectric material.

Finally, the source/drain regions 20 comprise a generally conventional n conductivity type dopant or p conductivity type dopant as is appropriate for a polarity of the field effect transistor that is illustrated in FIG. 1. As is understood by a person skilled in the art, the source/drain regions 20 are formed using a two step ion implantation method. A first ion implantation process step within the method uses the gate electrode 16, absent the spacer 18, as a mask to form a plurality of extension regions each of which extends beneath the spacer 18. A second ion implantation process step uses the gate electrode 16 and the spacer 18 as a mask to form the larger contact region portions of the plurality of source/drain regions 20, while simultaneously incorporating the plurality of extension regions. Dopant levels are from about 1e19 to about 1e21 dopant atoms per cubic centimeter within each of the plurality of source/drain regions 20. Extension regions within the plurality of source/drain regions 20 may under certain circumstances be more lightly doped than contact regions with the plurality of source/drain regions, although such differential doping concentrations are not a requirement of the invention.

Figure 2:
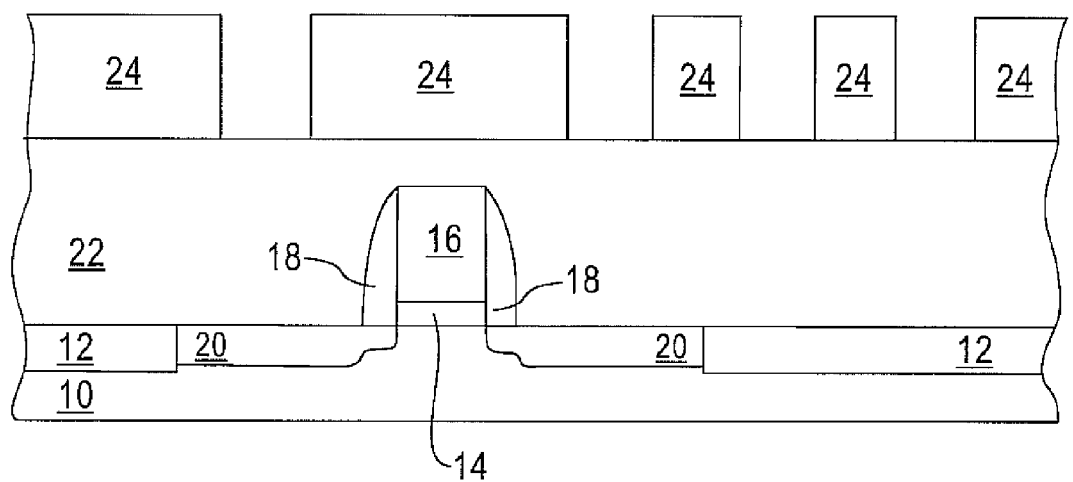

FIG. 2 first shows a first dielectric layer 22 located upon the semiconductor structure of FIG. 1. FIG. 2 also shows a first mask layer 24 located upon the first dielectric layer 22.

The first dielectric layer 22 may comprise any of several dielectric materials from which pre-metal dielectric layers, inter-level dielectric layers and intra-level dielectric layers may generally be fabricated within microelectronic structures, including semiconductor structures. Such dielectric materials may include (within the context of this particular passivating layer application) generally higher dielectric constant dielectric materials (i.e., having a dielectric constant from about 4 to about 20) such as but not limited to silicon oxides, silicon nitrides and silicon oxynitrides. Such dielectric materials may also include, but are not necessarily limited to, generally lower dielectric constant dielectric materials (i.e., having a dielectric constant from about 2.5 to about 4) such as but not limited to spin-on-glass dielectric materials, spin-on-polymer dielectric materials, micro-porous dielectric materials, nano-porous dielectric materials, fluorine doped dielectric materials and carbon doped dielectric materials. Also intended to be included within the context of the instant embodiment are laminates and composites of the foregoing dielectric materials. For reasons that will become clearer within the context of further disclosure below, such laminates may include generally higher hardness and higher dielectric constant dielectric materials as a planarizing stop layer within the first dielectric layer 22, although the same is not specifically illustrated within the schematic cross-sectional diagram of FIG. 2.

The first mask layer 24, similarly with subsequent mask layers that will be described in further detail below, typically comprises a resist mask material and more particularly a photoresist mask material. Candidate photoresist mask materials include positive photoresist materials, negative photoresist materials and hybrid photoresist materials (i.e., that exhibit characteristics of both positive photoresist materials and negative photoresist materials). Typically, the first mask layer 24 comprises a positive photoresist material or a negative photoresist material that has a thickness from about 500 to about 5000 angstroms.

As will be illustrated within the context of further disclosure below, the first mask layer 24 also preferably comprises a photoresist material that is susceptible to both a direct write radiation beam (i.e., such as a electron beam direct write radiation beam) and a reticle filtered optical radiation beam (i.e., such as but not limited to a 157 nm or 193 nm optical radiation beam). Certain types of photoresist materials, and in particular chemically amplified photoresist materials, may possess the foregoing desirable multiple exposure radiation sensitivity. Alternative types of photoresist materials are not excluded from having such a desirable multiple exposure radiation sensitivity.

Figure 3:
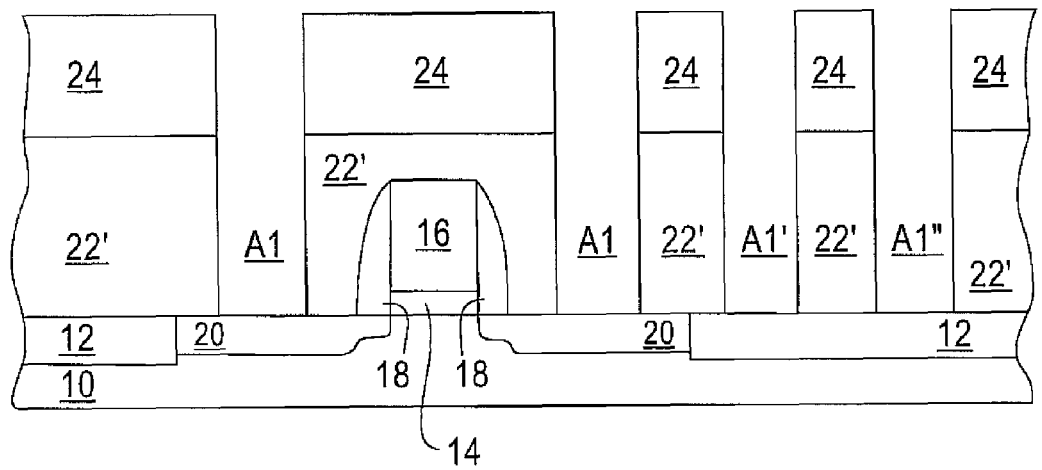

FIG. 3 shows the results of etching the first dielectric layer 22 to form a first dielectric layer 22' while using the first mask layer 24 as an etch mask. Although not specifically illustrated within the schematic diagram of FIG. 3, the foregoing etching is typically but not necessarily exclusively effected using at least in-part a plasma etch method that provides for generally straight sidewalls of the first dielectric layer 22'. When the first dielectric layer 22 comprises a silicon containing dielectric material, the first etching plasma typically comprises, at least in-part, a fluorine containing etchant gas composition, although neither the embodiment nor the invention is necessarily so limited.

As is illustrated within FIG. 3, the etching of the first dielectric layer 22 to form the first dielectric layer 22' provides a plurality of first apertures A1 that expose the plurality of source/drain regions 20, as well as a single first aperture A1' and a single first aperture A1" that expose one of the isolation regions 12. Although FIG. 3 illustrates the first aperture A1' and the first aperture A1" located exposing different portions of the same isolation region 12, the embodiment is not intended to be so limited. Rather, the first aperture A1' and the first aperture A1" may be formed over nominally separated isolation regions. As is illustrated in phantom in FIG. 3, the first aperture A1" and the first aperture A1" may additionally and optionally be etched into the isolation region 12 over which they are formed to thus provide apertures that are recessed at least in-part with respect to the semiconductor substrate 10.

Figure 4:
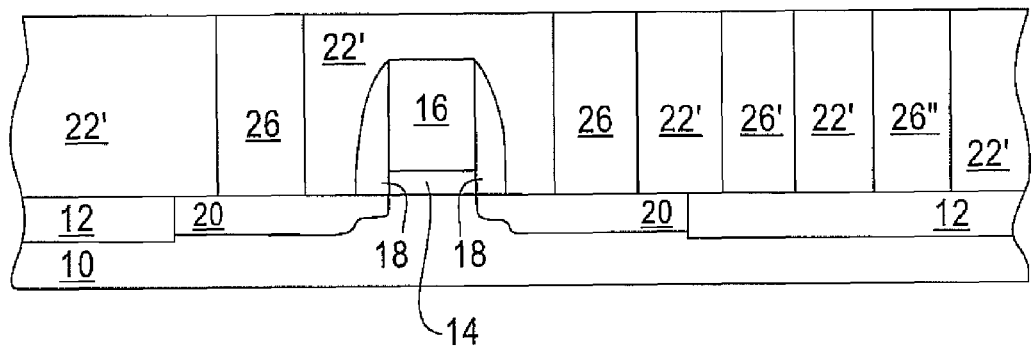

FIG. 4 first shows the results of stripping the first mask layer 24 from the semiconductor structure of FIG. 3, and in particular from the first dielectric layer 22' within the semiconductor structure of FIG. 3. The first mask layer 24 may be stripped using methods and materials that are otherwise generally conventional in the semiconductor fabrication art. Included in particular are wet chemical stripping methods and materials, dry plasma stripping methods and materials and aggregates of wet chemical stripping methods and materials and dry plasma stripping methods and materials.

FIG. 4 also shows a plurality of vias 26 located and formed within the plurality of first apertures A1 within the first dielectric layer 22' and contacting the source/drain regions 20. FIG. 4 finally shows an alignment mark 26' located and formed within the first aperture A1' within the first dielectric layer 22' and contacting the isolation region 12, and an alignment mark 26" located and formed within the first aperture A1" within the first dielectric layer 22' and also contacting the isolation region 12.

Although not exclusively within the embodiment or within the invention, the vias 26 and the alignment marks 26' and 26" are generally typically formed simultaneously. The vias 26 and the alignment marks 26' and 26" are thus also generally typically formed of the same material.

Within the embodiment, the alignment marks 26' and 26" at least comprise, and preferably consist essentially of, at least one material that includes a substantially present element that has an atomic number at least 5, and preferably at least 10, greater than a substantially present element within surrounding materials. Typically, within the context of a silicon semiconductor substrate, this provides that the alignment mark comprises an element that has an atomic number greater than about 19, and preferably from about 19 to about 109. As will be illustrated in further detail within the context of further description below, the use of such a generally high atomic number material for the alignment marks 26' and 26" in comparison with surrounding materials allows the alignment marks 26' and 26" to be readily registered within context of an electron beam alignment beam positive contrast with respect to surrounding materials. While by no means limiting the instant embodiment or the invention, a particularly desirable candidate material for the alignment marks 26' and 26" is a tungsten material. A tantalum material for the alignment marks 26' and 26" is also operative within the context of the embodiment and the invention. Other materials of appropriate atomic number are not necessarily excluded. However, for example, gold materials, while also theoretically operative by virtue of an atomic number in the desired range, may nonetheless not necessarily provide an alignment mark (such as the alignment mark 26' or 26") with desirable mechanical properties, physical properties or chemical properties.

The embodiment also contemplates that the semiconductor structure of FIG. 4 may also include a liner layer that separates the vias 26 and the alignment marks 26' and 26" from the first dielectric layer 22' and the source/drain regions 20, or the isolation regions 12. Such a liner layer (i.e., having a nominally "U" shape) is not specifically illustrated in FIG. 4. Under such circumstances, and depending upon the nature of composition of the liner layer, the liner layer may be an augmenting component to the alignment marks 26' and 26". Materials of composition of the liner layer may include, but are not necessarily limited to titanium and tantalum, as well as nitrides of titanium, tantalum and tungsten.

Within the instant embodiment, each of the vias 26 and the alignment marks 26' and 26" is typically separated from the first dielectric layer 22' and a source/drain region 20, or the pertinent isolation region 12, by a titanium sub-liner layer of thickness from about 10 to about 100 angstroms, upon which is located and formed a titanium nitride sub-liner layer of thickness from about 50 to about 300 angstroms, upon which in turn is located and formed the tungsten material that comprises a primary portion of the alignment marks 26' and 26". Each of the foregoing component materials for the sub-liner layers, the vias 26 and the alignment marks 26' and 26" may be formed using methods that are conventional in the semiconductor fabrication art. Included in particular are chemical vapor deposition methods and physical vapor deposition methods, which are preferably blanket layer deposition methods. As an adjunct to these methods, also used are planarizing methods, such as mechanical planarizing methods and chemical mechanical polish planarizing methods, for planarizing the blanket layers to form the liner layers, the vias 26 and the alignment marks 26' and 26".

Although not specifically illustrated in FIG. 4, the alignment marks 26' and 26" in plan-view may have any of several projected shapes. Included but not limiting are square, circular, rectangular, regular, irregular, continuous and discontinuous projected shapes. Typically, the alignment mark 26' has a linewidth from about 1000 to about 10000 nanometers when used as an electron beam alignment mark, and a thickness (i.e., typically the same thickness as the first dielectric layer 22') from about 1000 to about 3000 angstroms. When used for electron beam alignment, the alignment mask 26' is preferably square in shape with at least a 50 micrometer clearance to an adjacent structure. The alignment mark 26" when used for optical reticle alignment typically has a traditional cross or fringe shape.

Figure 5:
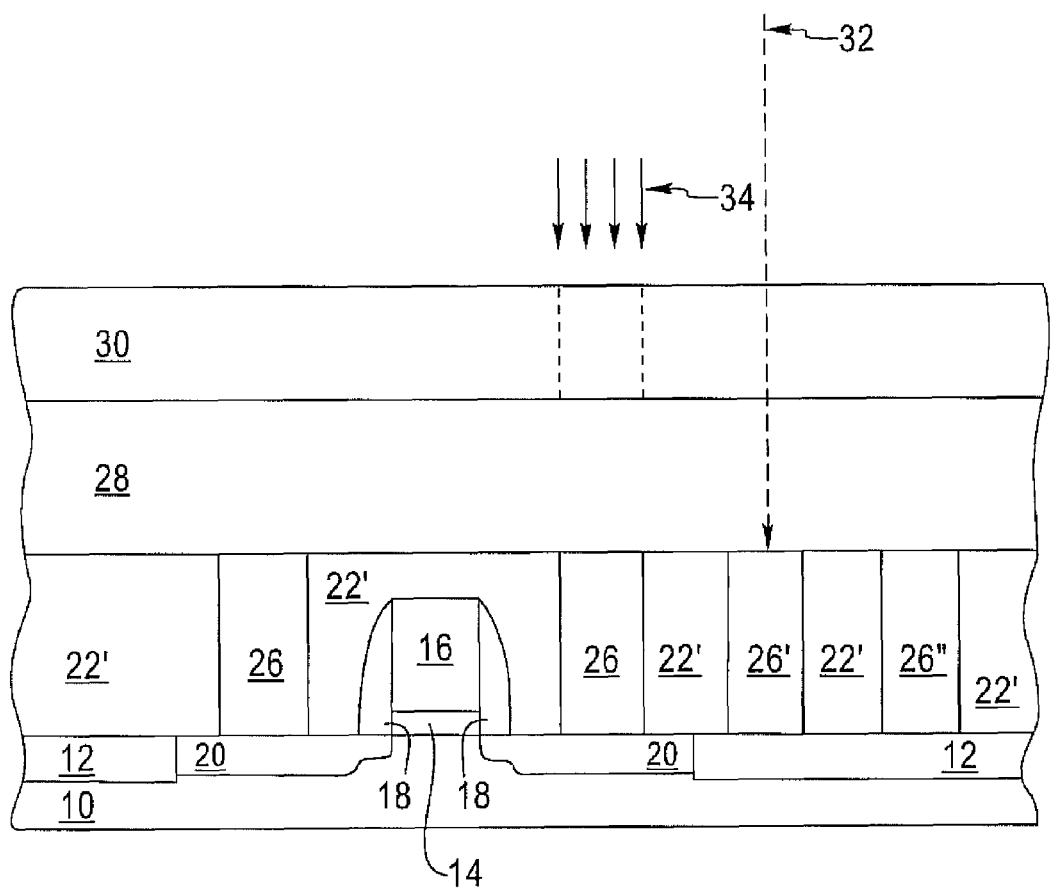

FIG. 5 first shows a second dielectric layer 28 located upon the semiconductor structure of FIG. 4. FIG. 5 also shows a second mask layer 30 located upon the second dielectric layer 28.

Within the instant embodiment, the second dielectric layer 28 may comprise materials, have dimensions and be formed using methods that are otherwise generally analogous, equivalent or identical to the materials, dimensions and methods that are used for forming the first dielectric layer 22 that is illustrated in FIG. 2.

Within the instant embodiment, the second mask layer 30 may comprise materials, have dimensions and be formed using methods that are otherwise also generally analogous, equivalent or identical to the materials, dimensions and methods that are used for forming the first mask layer 24 that is illustrated in FIG. 2. However, the first mask layer 24 that is illustrated in FIG. 2 is intended as a fully exposed and developed mask layer that comprises a patterned mask layer. In contrast thereto, the second mask layer 30 that is illustrated in FIG. 5 is intended as a once exposed mask layer in accordance with further description below.

As is illustrated in FIG. 5, the second mask layer 30 is once exposed with a direct write beam 34 that is aligned with respect to the substrate 10 and the second mask layer 30 while using an alignment beam 32 that aligns with respect to the alignment mark 26'. Within the instant embodiment, both the alignment beam 32 and the direct write beam 34 typically comprise an electron beam. An electron beam intensity may vary within the alignment beam 32, or the alignment bean 32 may otherwise be sufficiently narrow such that no latent image (i.e., such as the latent image that is formed with respect to the direct write beam 34) is necessarily formed within the second mask layer 30 due to interaction of the alignment beam 32 with a photoresist material from which may be comprised the second mask layer 30.

Figure 6:
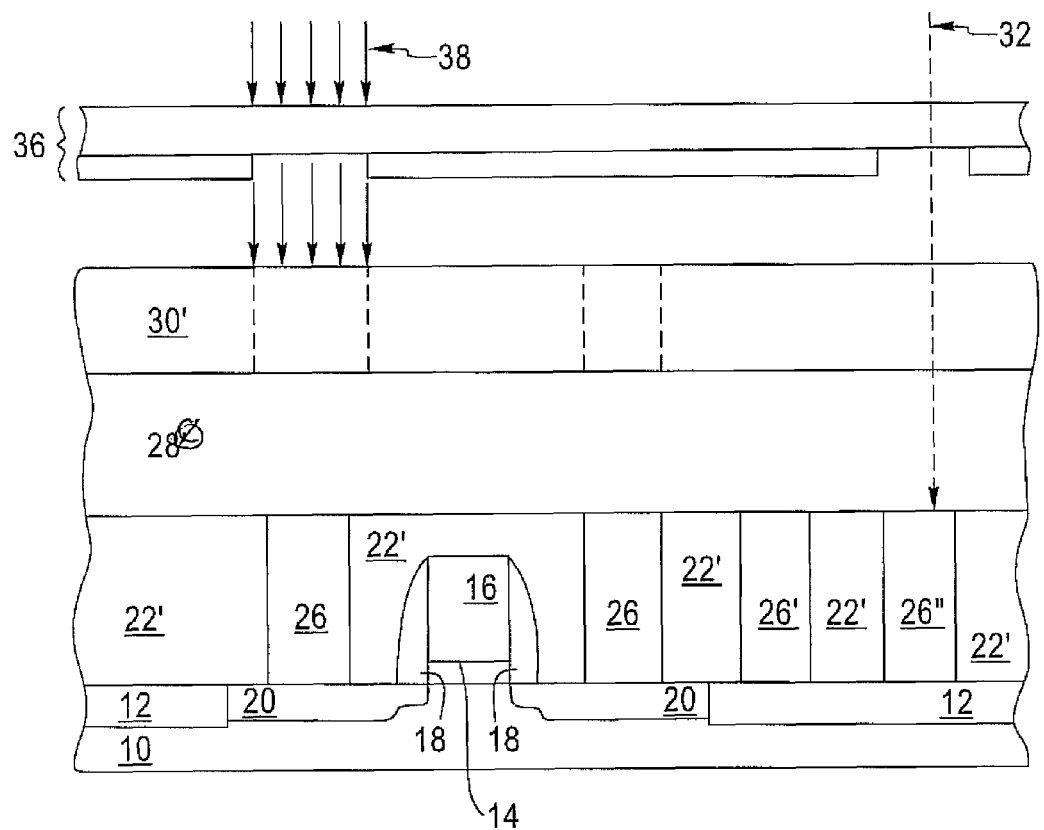

FIG. 6 shows the results of further exposure of the second mask layer 30 that is illustrated in FIG. 5 to form a second mask layer 30'. The further exposure of the second mask layer 30 to form the second mask layer 30' is, as is illustrated in FIG. 6, undertaken using a first reticle 36, in conjunction with an optical exposure beam 38. Thus, within the instant embodiment, the second mask layer 30' is exposed using both a direct write exposure method (generally for exposing finely critically dimensioned features) as well as using an optical exposure method (generally for exposing less finely critically dimensioned features or non-critically dimensioned features).

The first reticle 36 may be otherwise generally conventional within the context of the semiconductor fabrication art. The first reticle 36 may be selected from the group including but not limited to non-phase shift reticles, as well as phase shift reticles. As is further illustrated in FIG. 6, the first reticle 36 is registered with respect to the second mask layer 30' and the semiconductor substrate 10 through the alignment beam 32 and the alignment mark 26". Thus, within the instant embodiment, both a direct write exposure of the second mask layer 30' and an optical exposure of the second mask layer 30' are undertaken using potentially the same alignment beam 32, and with separate alignment marks 26' and 26" (although a single alignment mark may also be used) with respect to both a direct write beam 34 and an optical beam 38.

Figure 7:
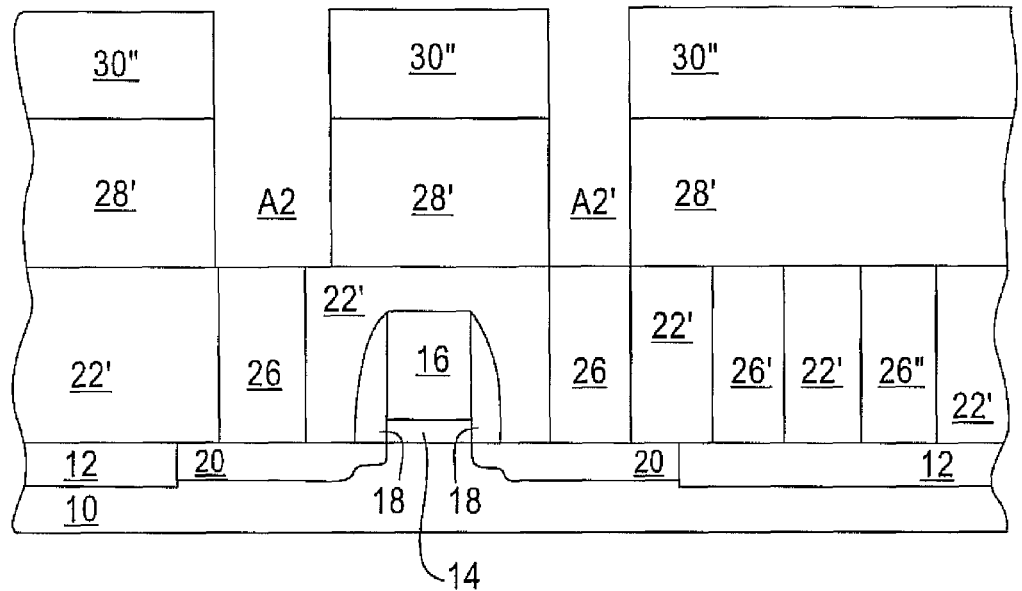

FIG. 7 first shows the results of developing the mask layer 30' to form a mask layer 30". The mask layer 30' may be developed to form the mask layer 30" while using photoresist developer methods and materials that are otherwise generally conventional in the semiconductor fabrication art. Within the context of the instant embodiment under circumstances where the mask layer 30' that is illustrated in FIG. 6 may comprise a photo acid generator based chemically amplified photoresist material (or an alternative appropriate photoresist material) that is susceptible to both electron beam radiation and optical radiation, such a multiply exposed mask layer may be developed in an aqueous alkaline photoresist developer, although neither the embodiment nor the invention is so limited.

FIG. 7 next shows the results of etching the second dielectric layer 28 to form a second dielectric layer 28' while using the second mask layer 30" as an etch mask. The foregoing etching is generally analogous to the etching that is used for etching the first dielectric layer 22 that is illustrated in FIG. 2 to provide the first dielectric layer 22' that is illustrated in FIG. 3. The foregoing etching also yields a plurality of second apertures A2 and A2' (i.e., where second aperture A2 has a wider linewidth than second aperture A2') that are separated by portions of the second dielectric layer 28'.

Figure 8:
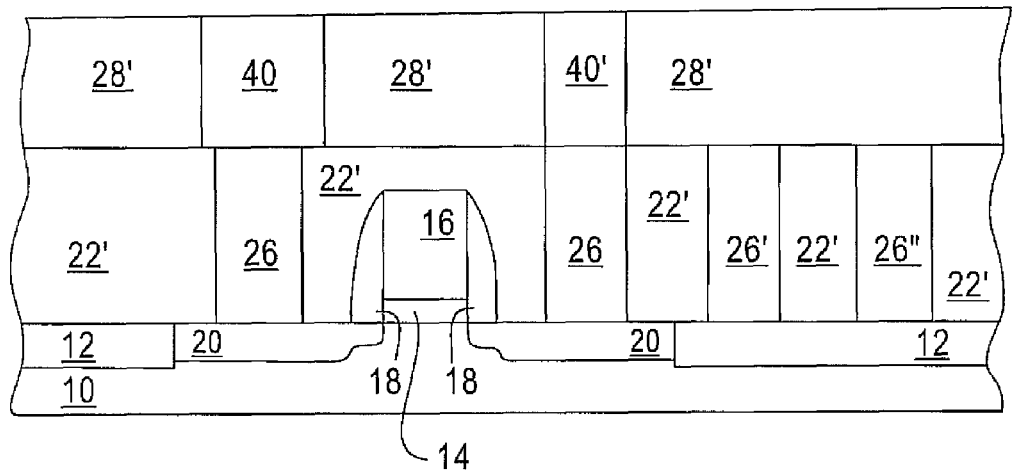

FIG. 8 shows the results of stripping the second mask layer 30" from the semiconductor structure of FIG. 7, and in particular stripping the second mask layer 30" from the second dielectric layer 28'. The second mask layer 30" may be stripped from the second dielectric layer 28' while using methods and materials that are analogous, equivalent or identical to the methods and materials that are used for stripping the first mask layer 24 that is illustrated in FIG. 3 from the first dielectric layer 22' that is illustrated in FIG. 3 to provide in-part the semiconductor structure whose schematic cross-sectional diagram is illustrated in FIG. 4.

FIG. 8 also shows a plurality of second conductor layers 40 and 40' located and formed into the plurality of second apertures A2 and A2'. The second conductor layer 40 is of wider linewidth than the second conductor layer 40'. The second conductor layers 40 and 40' may in general comprise any of several conductor materials that are conventional in the semiconductor fabrication art. However, within the context of the embodiment and of the invention, the second conductor layers 40 and 40' (as well as subsequent conductor layers) will generally comprise conductor materials that have an atomic number of less than about 35, and preferably from about 19 to about 35, at least in locations where the alignment beam 32 might of necessity penetrate through the second conductor layers 40 and 40'. Candidate conductor materials that fulfill the foregoing requirements include copper and copper alloy conductor materials, as well as doped polysilicon and certain polycide conductor materials. Also included as a non-limiting example is an aluminum containing conductor material. Alternatively, the second conductor layers 40 and 40' comprise a conductor material having an atomic number at least 10 less, and preferably about 20 less than the alignment mark.

Figure 9:
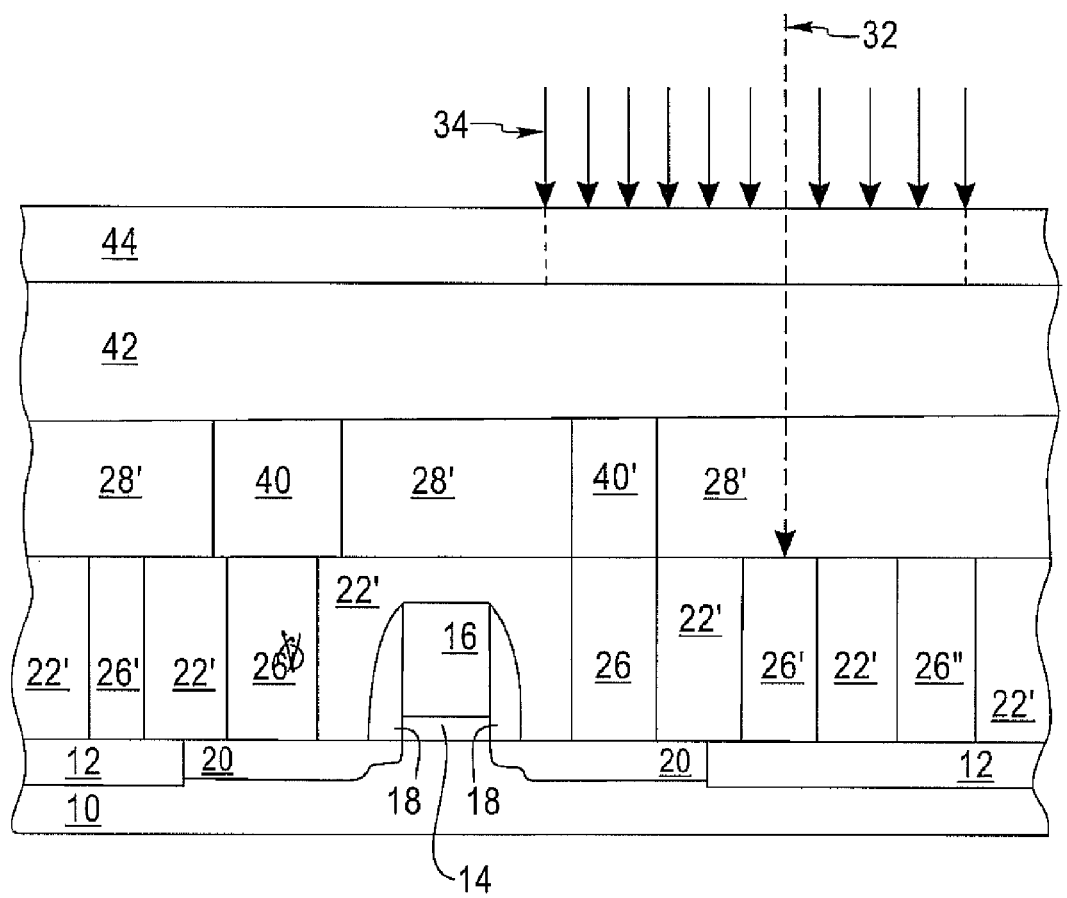

FIG. 9 first shows a third dielectric layer 42 located and formed upon the semiconductor structure of FIG. 8. FIG. 9 also shows a third mask layer 44 located and formed upon the third dielectric layer 42.

The third dielectric layer 42 may comprise materials, have dimensions and be formed using methods analogous, equivalent or identical to the materials, dimensions and methods that are used within the context of the second dielectric layer 28 that is illustrated in FIG. 5 and the first dielectric layer 22 that is illustrated in FIG. 2.

The third mask layer 44 may comprise materials, have dimensions and be formed using methods analogous, equivalent or identical to the materials, dimensions and methods used within the context of the second mask layer 30 that is illustrated in FIG. 5, and to a lesser extent the first mask layer 24 that is illustrated in FIG. 2.

Similarly, in particular with the second mask layer 30 that is illustrated in FIG. 5, the third mask layer 44 is also a direct write exposed mask layer that is directly written while using the direct write beam 34 which again is properly positioned with respect to the third mask layer 44 and the semiconductor substrate 10 while using the alignment beam 32 for aligning with respect to the alignment mark 26'.

Figure 10:
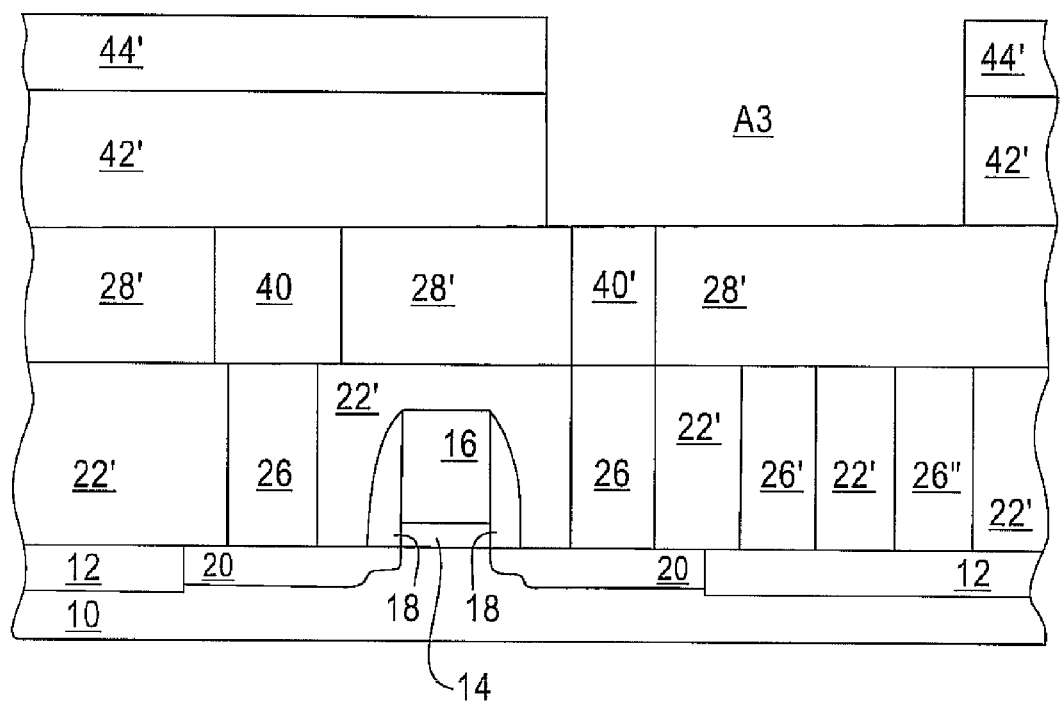

FIG. 10 first shows the results of developing the third mask layer 44 to form a third mask layer 44'. The third mask 44 may be developed to form the third mask 44' while using methods and materials analogous, equivalent or identical to the methods and materials that are used for developing the second mask layer 30' that is illustrated in FIG. 6 to form the second mask layer 30" that is illustrated in FIG. 7.

FIG. 10 next shows the results of etching the third dielectric layer 42 to form a third dielectric layer 42', while using the third mask layer 44' as an etch mask layer. The foregoing etching may be analogous, equivalent or identical to the etching that is used for etching the second dielectric layer 28 that is illustrated in FIG. 6 to form the second dielectric layer 28' that is illustrated in FIG. 7, or the first dielectric layer 22 that is illustrated in FIG. 2 to form the to form the first dielectric layer 22' that is illustrated in FIG. 3. FIG. 10 also shows a third aperture A3 located within the third dielectric layer 42' and exposing the second conductor layer 40'.

Figure 11:
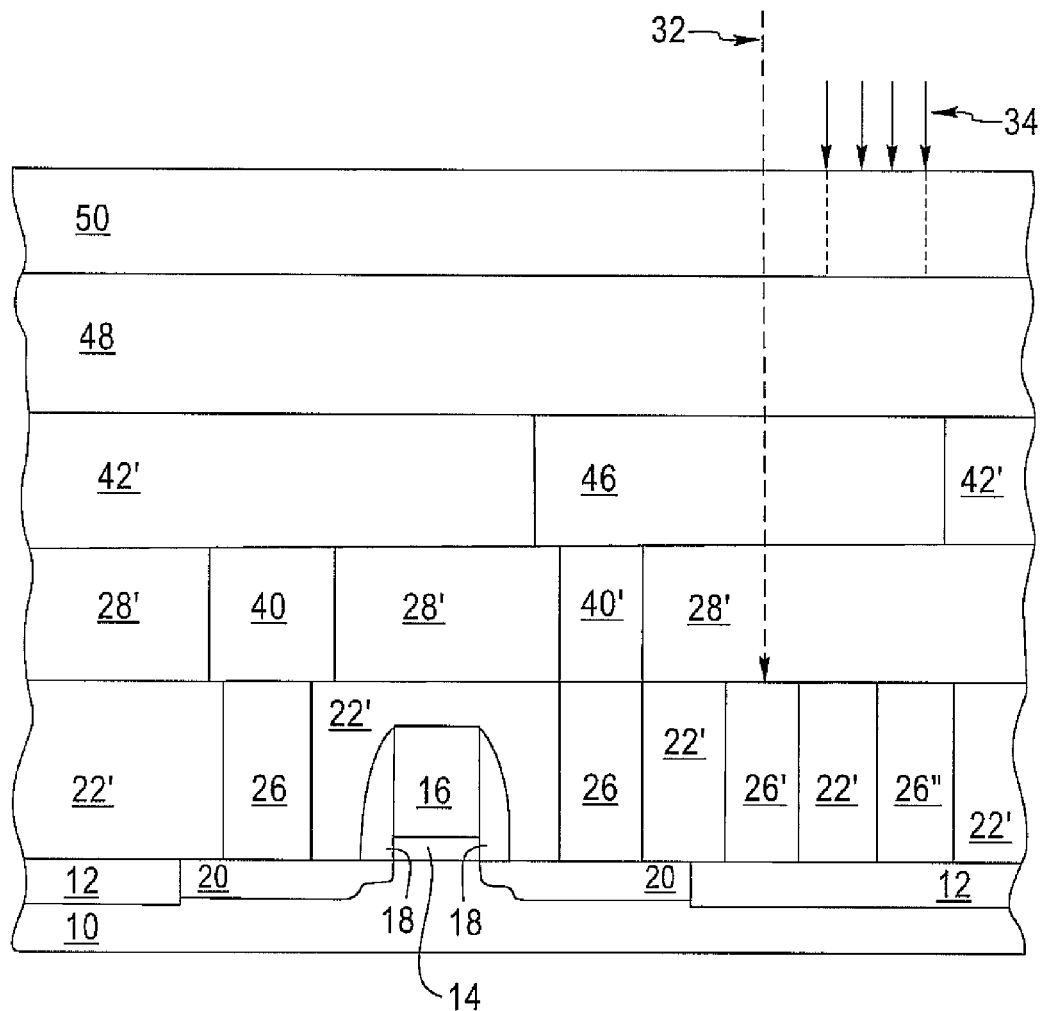

FIG. 11 first shows the results of stripping the third mask layer 44' from the semiconductor structure of FIG. 10. The third mask layer 44' may be stripped using methods and materials analogous, equivalent or identical to the methods and materials that are used for stripping previous mask layers used in-part for fabricating the semiconductor structure of FIG. 11.

FIG. 11 also shows a third conductor layer 46 located and formed and into the third aperture A3. The third conductor layer 46 is planarized to the level of the third dielectric layer 42'. The third conductor layer 46 may comprise materials, have dimensions and be formed using methods analogous, equivalent or identical to the materials, dimensions and methods that are used for forming the second conductor layers 40 and 40'.

FIG. 11 next shows a fourth dielectric layer 48 located and formed upon the semiconductor structure of FIG. 10, after locating and forming the third conductor layer 46 within the third aperture A3. FIG. 11 also shows a fourth mask layer 50 located and formed upon the fourth dielectric layer 48.

The fourth dielectric layer 48 is otherwise analogous, equivalent or identical to the third dielectric layer 42 that is illustrated in FIG. 9, the second dielectric layer 28 that is illustrated in FIG. 5 or the first dielectric layer 22 that is illustrated in FIG. 2.

The fourth mask layer 50 is otherwise analogous, equivalent or identical to the third mask layer 44 that is illustrated in FIG. 9, the second mask layer 30 that is illustrated in FIG. 5 or to a lesser extent the first mask layer 24 that is illustrated in FIG. 2.

Similarly in particular with the third mask layer 44 and the second mask layer 30, and also plausibly within the context of the first mask layer 24, the fourth mask layer 50 is also a direct write exposed mask layer that is directly written while using the direct write beam 34 that is aligned with respect to the semiconductor substrate 10 while using the alignment beam 32 and the alignment mark 26'. However, in the instance of exposing the fourth mask layer 50 with the direct write beam 34, the alignment beam 32 penetrates the third conductor layer 46. Within the context of the embodiment and the invention, since the third conductor layer 46 comprises a generally lower atomic weight material in comparison with the alignment mark 26', the alignment beam 32 when comprising an electron beam may readily align to the alignment mark 26' even when passing through the third conductor layer 46.

Figure 12:
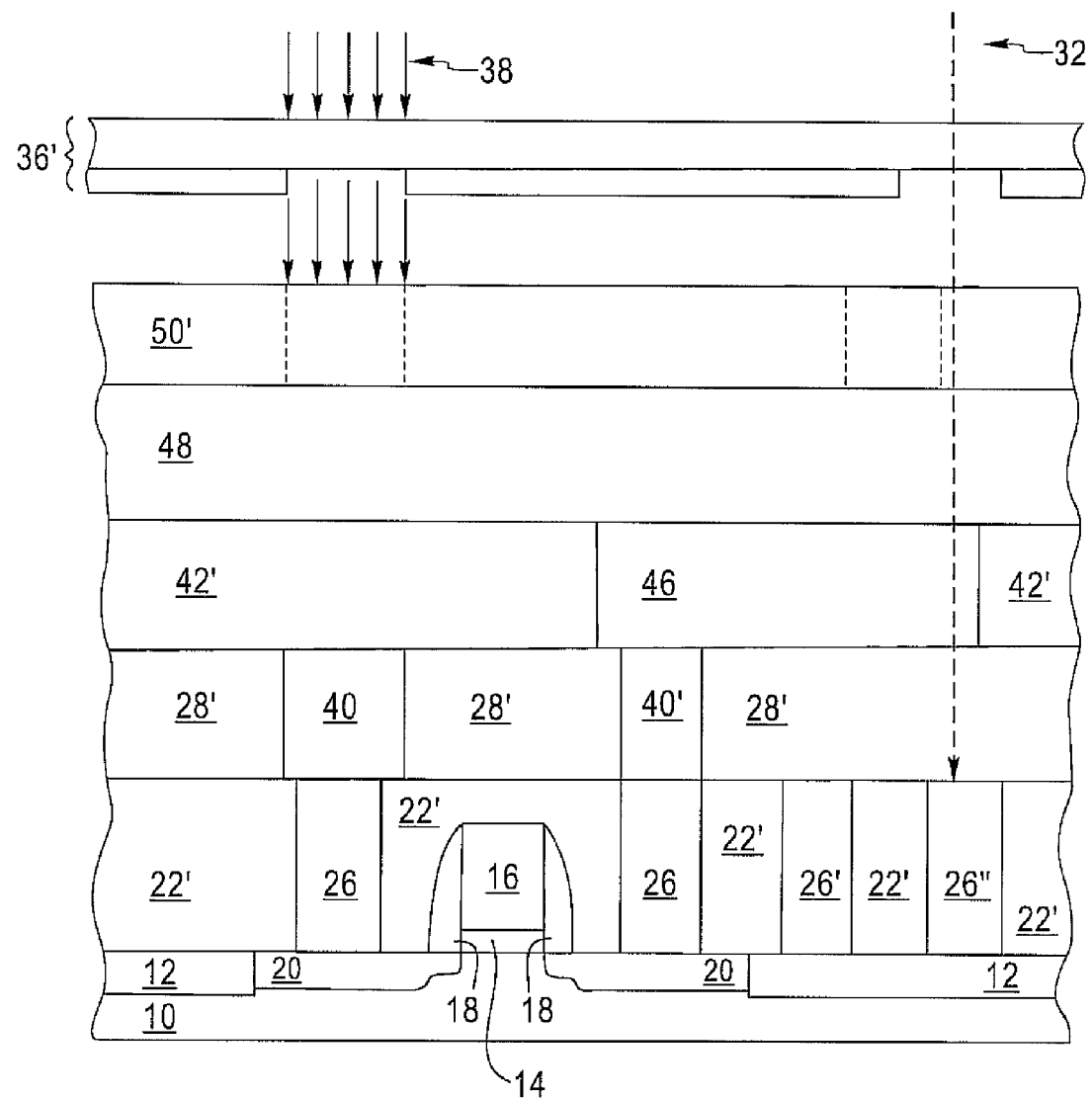

FIG. 12 shows the results of optically exposing the fourth mask layer 50 to form a fourth mask layer 50', while using a second reticle 36' in conjunction with the optical exposure beam 38. The foregoing optical exposure of the fourth mask layer 50 to form the fourth mask layer 50' is otherwise analogous, equivalent or identical to the optical exposure of the second mask layer 30 that is illustrated in FIG. 5 to form the second mask layer 30' that is illustrated in FIG. 6. Thus, similarly with the second mask layer 30', the fourth mask layer 50' is also both direct write exposed with the direct write beam 34 and optical beam exposed with the optical beam 38. However dissimilarly with the second mask layer 30', the fourth mask 50' is both direct write exposed and optical beam exposed while using an alignment beam 32 that passes through a conductor layer (i.e., the third conductor layer 46).

Figure 13:
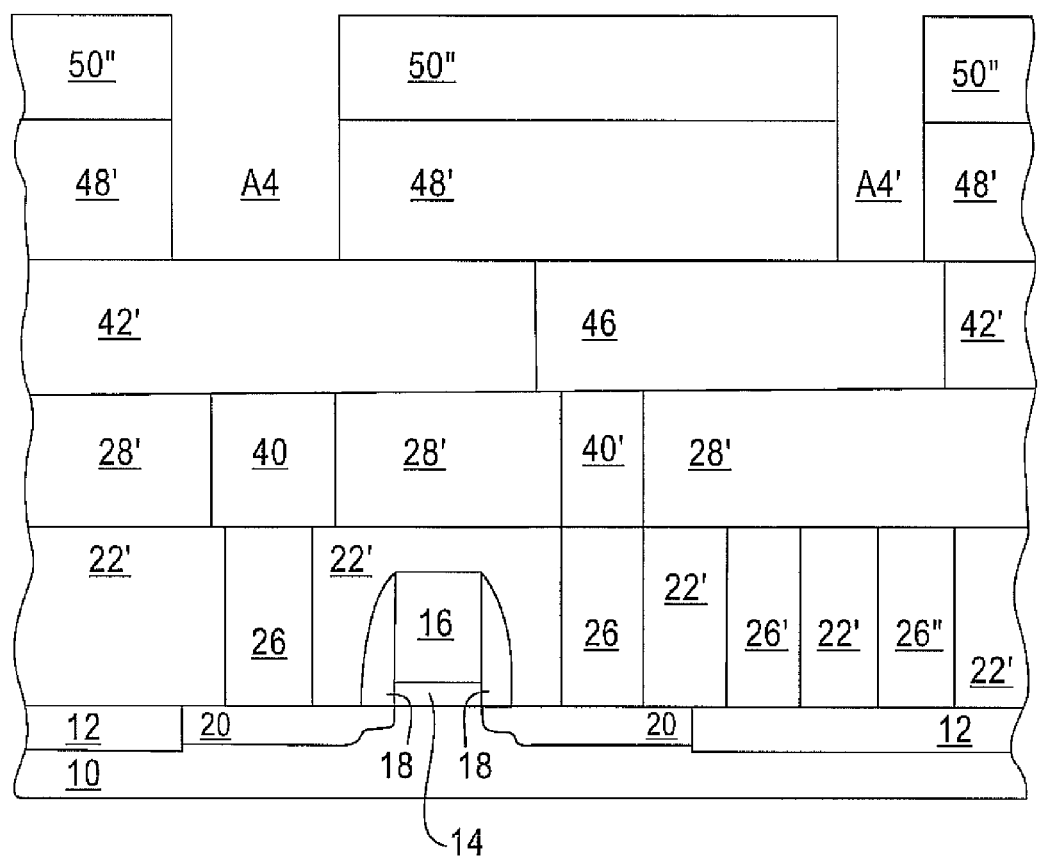

FIG. 13 first shows the results of developing the fourth mask 50' to form a fourth mask 50". The fourth mask 50' may be developed to form the fourth mask 50" while using methods and materials analogous, equivalent or identical to the methods and materials that are used for developing preceding exposed mask layers used for fabricating the semiconductor structure that is illustrated in FIG. 13.

FIG. 13 also shows the result of etching the fourth dielectric layer 48 to form a fourth dielectric layer 48' while using the fourth mask layer 50" as an etch mask layer. FIG. 13 also shows a plurality of fourth apertures A4 and A4' located within the fourth dielectric layer 48' incident to such etching. The foregoing etching is similarly analogous, equivalent or identical to the related etching that is used to form the third dielectric layer 42', the second dielectric layer 28' and the first dielectric layer 22' within the semiconductor structure that is illustrated in FIG. 13.

Figure 14:
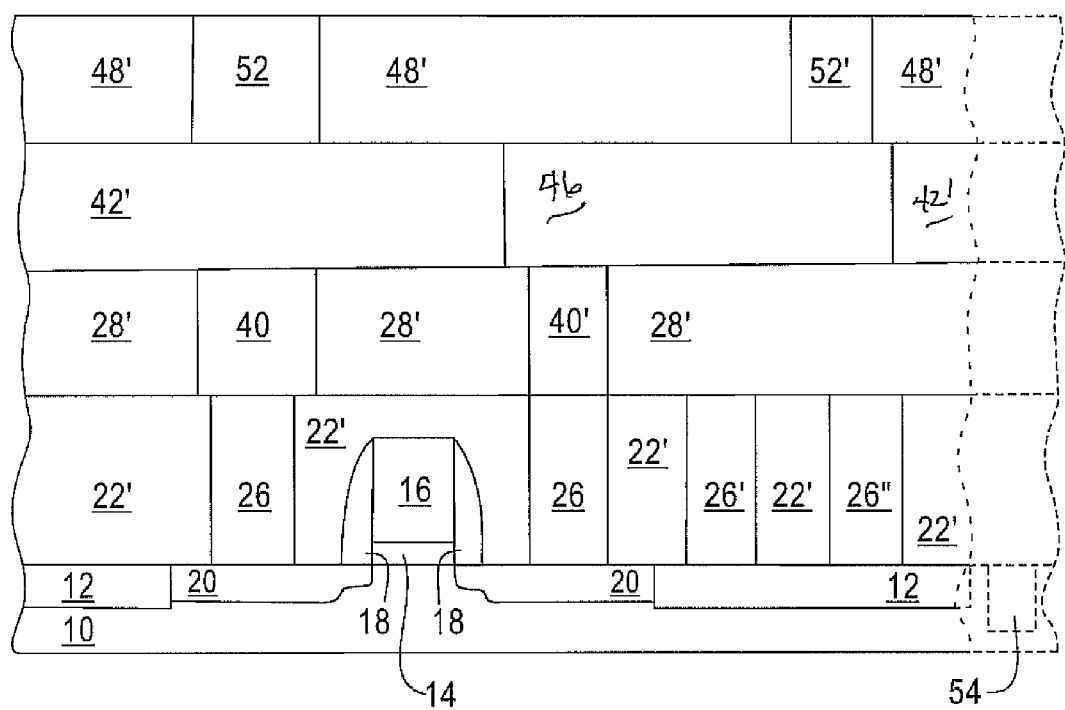

FIG. 14 first shows the results of stripping the fourth mask layer 50" from the fourth dielectric layer 48'. The fourth mask layer 50" may be stripped from the fourth dielectric layer 48' while using methods and materials analogous, equivalent or identical to those used for stripping preceding mask layers from corresponding dielectric layers when fabricating the semiconductor structure whose schematic cross-sectional diagram is illustrated in FIG. 14.

FIG. 14 finally shows the results of forming a plurality of fourth conductor layers 52 and 52' into the plurality of fourth apertures A4 and A4'. The fourth conductor layers 52 and 52' may be formed and located into the fourth apertures A4 and A4' while using methods and materials analogous, equivalent or identical to the methods and materials that are used for forming underlying conductor layers within the semiconductor structure whose schematic cross-sectional diagram is illustrated in FIG. 14.

FIG. 14 shows a schematic cross-sectional diagram of a semiconductor structure in accordance with an embodiment of the invention. The semiconductor structure includes, located over a semiconductor substrate 10, an alignment mark 26' that at least comprises, and preferably consists essentially of, at least one substantially present element that has an atomic number at least 5 greater than a highest atomic number substantially present element within surrounding materials An alignment mark of such a material composition is readily alignable using an electron beam alignment beam that may penetrate through other conductor materials and conductor layers (i.e. such as the third conductor layer 46) having an atomic number less than about 35, and preferably from about 19 to about 35. In addition, the alignment mark 26' when coupled with such an alignment beam 32 (i.e., as is illustrated, for example in FIG. 11 and FIG. 12), may be used to align the semiconductor substrate 10 and a mask layer (i.e., photoresist mask layer) located thereover, with respect to a direct write beam 34 or a reticle filtered optical beam 38.

The instant embodiment illustrates the invention within the context of an alignment mark 26' that is located within a semiconductor structure and formed simultaneously with a plurality of vias 26. Thus, the instant embodiment provides a semiconductor structure where back end of line (BEOL) structures (i.e., post silicon processing structures) may be aligned to a single alignment mark to thus provide superior overlay alignment accuracy even when an alignment mark is not uncovered (i.e., the alignment mark is buried and covered with additional layers and structures). However, neither the embodiment nor the invention is intended to be so limited, Rather the embodiment also contemplates that an alignment mark (i.e., similar to the alignment mark 26') in accordance with the invention may be located embedded within a semiconductor substrate rather than located primarily embedded above the semiconductor substrate at a contact via 26 level. Such an alignment mark 54 is illustrated in phantom in FIG. 14. Such an alternative location of the alignment mark 54 embedded within the semiconductor substrate 10 prior to forming other semiconductor structures within or upon the semiconductor substrate 10 provides value within the context of the invention insofar as such a location for the alignment mark 54 provides for alignment of both front end of line (FEOL) structures (i.e., silicon processing structures) and back end of line (BEOL) structures (i.e., dielectric and metallization structures) while using a single alignment mark (i.e., successive overlay errors are generally not propagated when using a single alignment mark).

The preferred embodiment is illustrative of the invention rather than limiting of the invention. Revisions and modifications may be made to methods, materials, structures and dimension of a semiconductor structure and method for fabrication thereof in accordance with the preferred embodiment, while still providing a microelectronic structure and method for fabrication thereof in accordance with the invention, further in accordance with the accompanying claims.

What is claimed is:

1. A microelectronic structure comprising a substrate and at least two alignment marks located over at least a portion of the substrate, wherein each of the at least two alignment marks are separated from an adjacent alignment mark by a distance of at least 50 microns, wherein the each of the at least two alignment marks comprise at least one substantially present element that has an atomic number at least 5 greater than a highest atomic number substantially present element within the substrate.

2. The microelectronic structure of claim 1 wherein the at least two alignment marks are located embedded within the substrate.

3. The microelectronic structure of claim 1 wherein the at least two alignment marks are located above the substrate.

4. The microelectronic structure of claim 1 wherein the substrate comprises a bulk semiconductor substrate.

5. The microelectronic structure of claim 1 wherein the substrate comprises a semiconductor-on-insulator substrate.

6. The microelectronic structure of claim 1 wherein the substrate includes semiconductor devices.

7. The microelectronic structure of claim 1 wherein the at least two alignment marks consist essentially of the at least one element that has an atomic number greater than about 19.

8. The microelectronic structure of claim 1 wherein the at least two alignment marks include at least one element that has an atomic number from about 19 to about 109.

9. The microelectronic structure of claim 1 wherein the at least two alignment marks include tantalum.

10. The microelectronic structure of claim 1 wherein the at least two alignment marks include tungsten.

11. The microelectronic structure of claim 1 further comprising a conductor layer located over the at least two alignment marks and covering the at least two alignment marks.

12. The microelectronic structure of claim 1 wherein the conductor layer comprises at least one element that has an atomic number at least 10 less than the at least two alignment marks.

* * * * *